(12) United States Patent
Chen

(10) Patent No.: US 10,971,472 B2
(45) Date of Patent: Apr. 6, 2021

(54) METHOD OF LIQUID ASSISTED BONDING

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 168 days.

(21) Appl. No.: 16/505,716

(22) Filed: Jul. 9, 2019

(65) Prior Publication Data
US 2021/0013174 A1    Jan. 14, 2021

(51) Int. Cl.
    H01L 21/00    (2006.01)
    H01L 23/00    (2006.01)

(52) U.S. Cl.
    CPC .... *H01L 24/83* (2013.01); *H01L 2224/83203* (2013.01); *H01L 2224/83359* (2013.01); *H01L 2224/83825* (2013.01); *H01L 2924/0105* (2013.01); *H01L 2924/01022* (2013.01); *H01L 2924/01029* (2013.01); *H01L 2924/01049* (2013.01)

(58) Field of Classification Search
    CPC ........... H01L 24/83; H01L 2224/83203; H01L 2224/83359; H01L 2224/83825; H01L 2924/01022; H01L 2924/01029; H01L 2924/01049; H01L 2924/0105
    See application file for complete search history.

(56) References Cited

U.S. PATENT DOCUMENTS

| 9,331,149 | B2 * | 5/2016 | Tong | ........................ H01L 24/26 |
| 10,434,749 | B2 * | 10/2019 | Tong | ......................... B32B 7/04 |
| 2015/0048523 | A1 * | 2/2015 | Suga | ........................ H01L 24/33 |

FOREIGN PATENT DOCUMENTS

TW    201307359 A    2/2013

* cited by examiner

*Primary Examiner* — Richard A Booth
(74) *Attorney, Agent, or Firm* — CKC & Partners Co., LLC

(57) ABSTRACT

A method of liquid assisted bonding includes: forming a structure with a liquid layer between an electrode of a device and a contact pad of a substrate, and two opposite surfaces of the liquid layer being respectively in contact with the electrode and the contact pad in which hydrogen bonds are formed between the liquid layer and at least one of the electrode and the contact pad; and evaporating the liquid layer to break said hydrogen bonds such that at least one of a surface of the electrode facing the contact pad and a surface of the contact pad facing the electrode is activated so as to assist a formation of a diffusion bonding between the electrode of the device and the contact pad in which a contact area between the electrode and the contact pad is smaller than or equal to about 1 square millimeter.

20 Claims, 10 Drawing Sheets

100 forming a structure with a liquid layer between an electrode of a device and a contact pad of a substrate and two opposite surfaces of the liquid layer being respectively in contact with the electrode and the contact pad in which hydrogen bonds are formed between the liquid layer and at least one of the electrode and the contact pad — 110 evaporating the liquid layer to break said hydrogen bonds such that at least one of a surface of the electrode facing the contact pad and a surface of the contact pad facing the electrode is activated so as to assist a formation of a diffusion bonding between the electrode of the device and the contact pad — 120

METHOD OF LIQUID ASSISTED BONDING

BACKGROUND

Field of Invention

The present disclosure relates to a method of liquid assisted bonding.

Description of Related Art

The statements in this section merely provide background information related to the present disclosure and do not necessarily constitute prior art.

Traditional technologies for transferring of devices include transfer by wafer bonding from a transfer wafer to a receiving substrate. One such implementation is "direct bonding" involving one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts try to overcome difficulties in making a massive transfer of devices (i.e., transferring millions or tens of millions of devices) possible for commercial applications. Among those difficulties, cost down, time efficiency, and yield are three of the important issues.

SUMMARY

According to some embodiments of the present disclosure, a method of liquid assisted bonding is provided. The method includes: forming a structure with a liquid layer between an electrode of a device and a contact pad of a substrate, and two opposite surfaces of the liquid layer being respectively in contact with the electrode and the contact pad, in which hydrogen bonds are formed between the liquid layer and at least one of the electrode and the contact pad; and evaporating the liquid layer to break said hydrogen bonds such that at least one of a surface of the electrode facing the contact pad and a surface of the contact pad facing the electrode is activated so as to assist a formation of a diffusion bonding between the electrode of the device and the contact pad, in which a contact area between the electrode and the contact pad is smaller than or equal to about 1 square millimeter.

According to some embodiments of the present disclosure, a method of liquid assisted bonding is provided. The method includes: forming a structure with a liquid layer between an electrode of a device and a contact pad of a substrate, and two opposite surfaces of the liquid layer being respectively in contact with the electrode and the contact pad in which hydrogen bonds are formed between the liquid layer and at least one of the electrode and the contact pad; evaporating the liquid layer to break said hydrogen bonds such that at least one of a surface of the electrode facing the contact pad and a surface of the contact pad facing the electrode is activated so as to assist a formation of a diffusion bonding between the electrode of the device and the contact pad; and heating the substrate to a temperature point below a melting point of one of the electrode and the contact pad to form the diffusion bonding in which said one of the electrode and the contact pad comprises at least one of copper, titanium, tin, and indium, and the other of the electrode and the contact pad comprises conductive oxide.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 3C' is a schematic cross-sectional view of an intermediate stage of a method of liquid assisted bonding according to some embodiments of the present disclosure;

DETAILED DESCRIPTION

Figure 1:
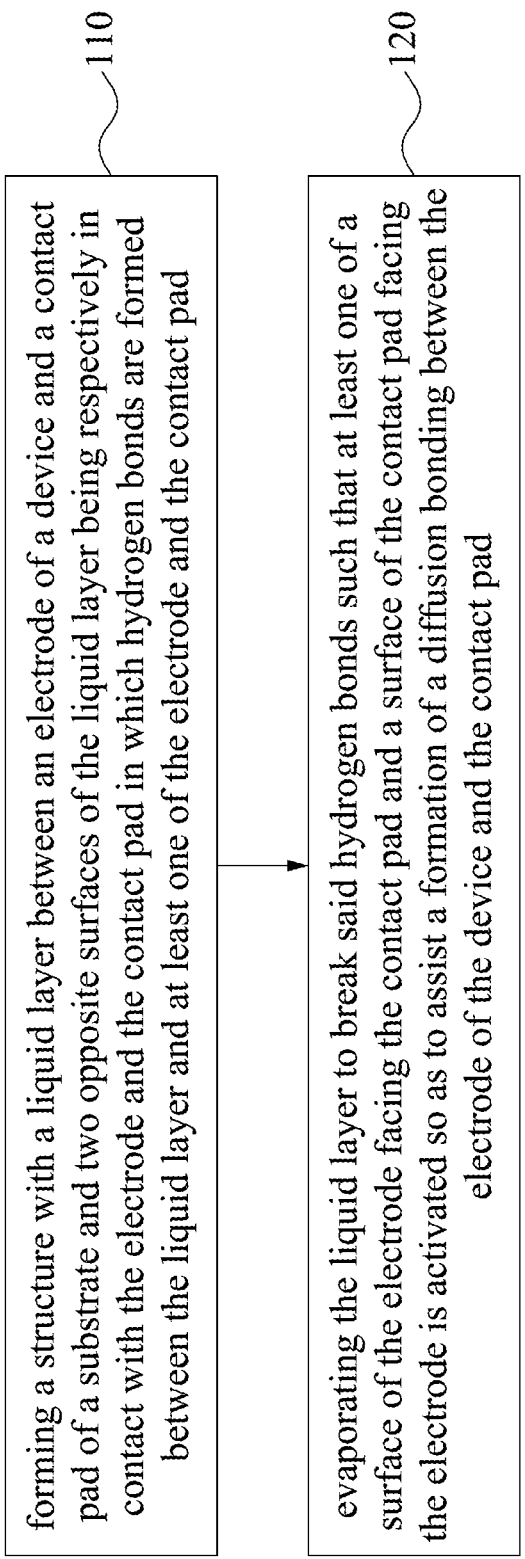
FIG. 1 is a flow chart of a method of liquid assisted bonding according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2:
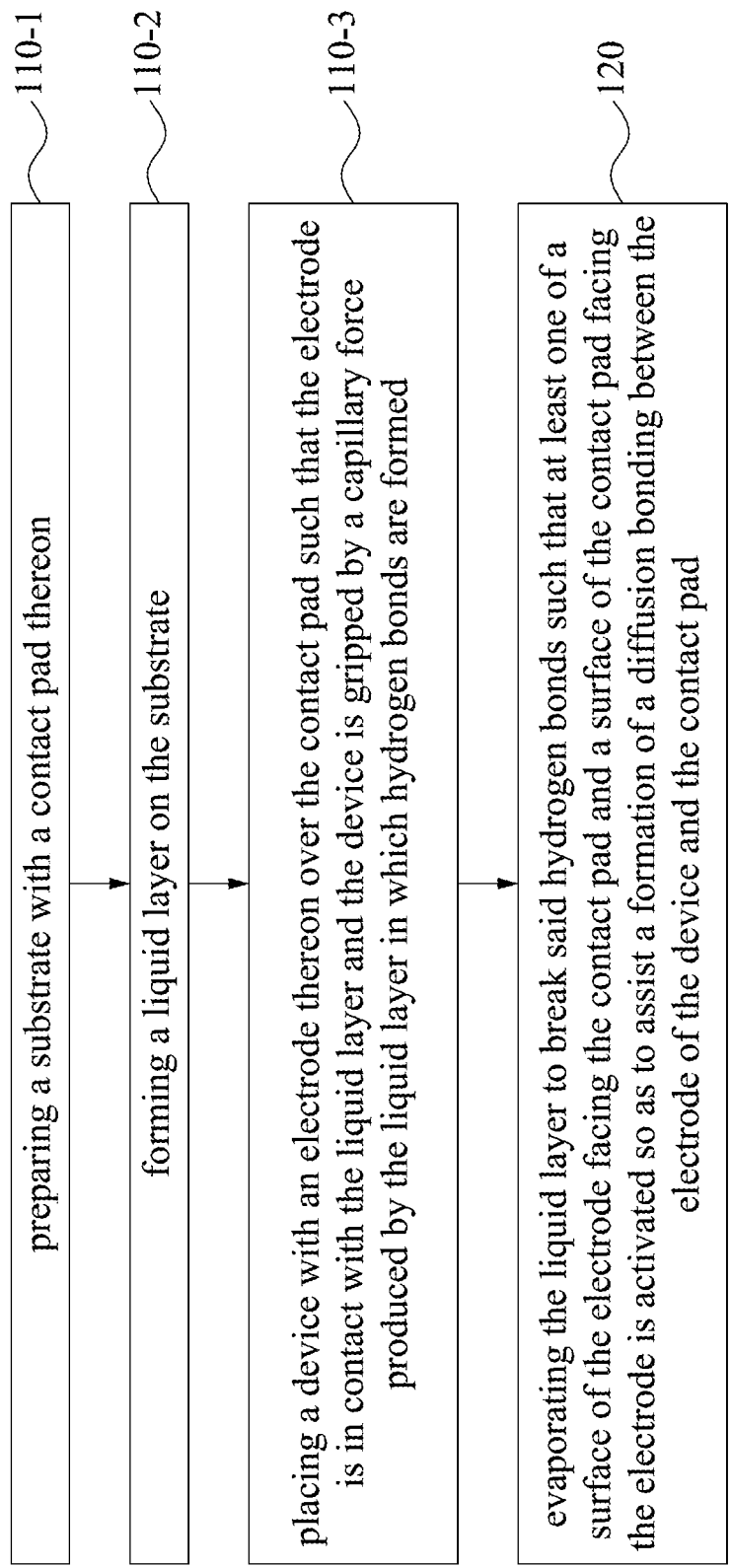
FIG. 2 is a flow chart of some embodiments of a method of liquid assisted bonding according to some embodiments of the present disclosure.

FIG. 1 is a flow chart of a method 100 of liquid assisted bonding according to some embodiments of the present disclosure. FIG. 2 is a flow chart of some embodiments of the method 100 as illustrated by FIG. 1. FIGS. 3A to 3D are schematic cross-sectional views of intermediate stages of the method 100 of FIGS. 1 and 2 according to some embodiments of the present disclosure.

Reference is made to FIGS. 1 to 3D. The method 100 of liquid assisted bonding begins with operation 110 in which a structure S with a liquid layer 230 between an electrode 242 of a device 240 and a contact pad 220 of a substrate 210 is formed (as referred to FIGS. 3C and 3C'). Two opposite surfaces of the liquid layer 230 are respectively in contact with the electrode 242 and the contact pad 220. Operation 110 can be performed in various ways, and one of them is shown in FIG. 2, but should not be limited thereto. Operation 110 begins with operation 110-1 in which the substrate 210 with a contact pad 220 thereon is prepared (as referred to FIG. 3A). Operation 110 continues with operation 110-2 in which the liquid layer 230 is formed on the substrate 210 (as referred to FIG. 3B). Operation 110 continues with operation 110-3 in which the device 240 including the electrode 242 which faces the contact pad 220 on the substrate 210 is placed over the contact pad 220 such that the device 240 is in contact with the liquid layer 230 (as referred to FIGS. 3C and 3C'). The method 100 continues with operation 120 in which the liquid layer 230 is evaporated such that the electrode 242 is bound to and is in electrical contact with the contact pad 220 (as referred to FIG. 3D).

Although in the previous paragraph only "a" device 240 and a contact pad 220 are mentioned, "multiple" devices 240 and contact pads 220 may be used in practical applications and is still within the scope of the present disclosure, and will not be emphasized in the disclosure.

Figure 3A:
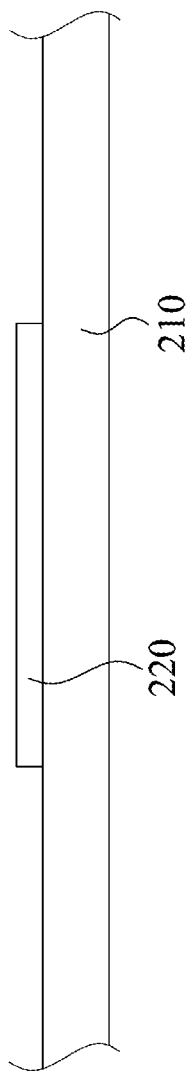
FIG. 3A is a schematic cross-sectional view of an intermediate stage of a method of liquid assisted bonding according to some embodiments of the present disclosure.
Figure 3B:
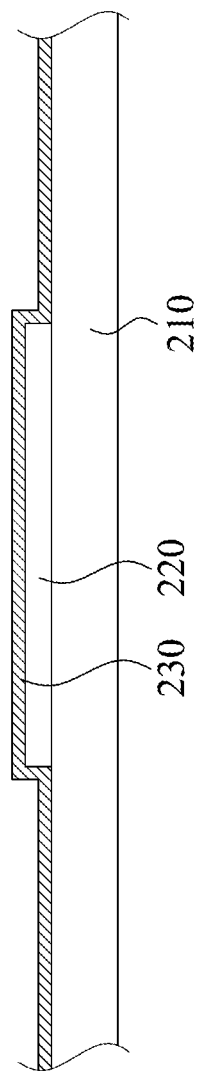
FIG. 3B is a schematic cross-sectional view of an intermediate stage of a method of liquid assisted bonding according to some embodiments of the present disclosure.

Reference is made to FIG. 3B. In some embodiments, the liquid layer 230 is formed on the substrate 210 and the contact pad 220. In some embodiments, the contact pad 220 is conductive. In some embodiments, the contact pad 220 includes a bonding material. The bonding material includes one of tin, indium, titanium, or a combination thereof. One of tin, indium, and titanium accounts for more than half of a number of atoms of the bonding material. In some embodiments, the contact pad 220 includes one of copper and a copper-rich material. The copper-rich material is a material with copper accounts for more than half of a number of atoms therein. Although the liquid layer 230 is continuously distributed and covering the substrate 210 and the contact pad 220 as shown in FIG. 3B, the liquid layer 230 can also be discontinuously distributed on the substrate 210, such as an island-like liquid layer 230 covering the contact pad 220.

In some embodiments, the liquid layer 230 includes water. In some embodiments, the liquid layer 230 is formed by lowering a temperature of the substrate 210 in an environment including a vapor such that at least a portion of the vapor is condensed to form the liquid layer 230. In some embodiments, the temperature of the substrate 210 is lowered to about the dew point to form the liquid layer 230. In some embodiments, the liquid layer 230 is formed by showering a vapor to the substrate 210 such that at least a portion of the vapor is condensed to form the liquid layer 230 on the substrate 210. Specifically, the vapor includes water. In some embodiments, the vapor showered has a water vapor pressure higher than an ambient water vapor pressure. In some embodiments, the vapor showered consists essentially of nitrogen and water.

Figure 3C:
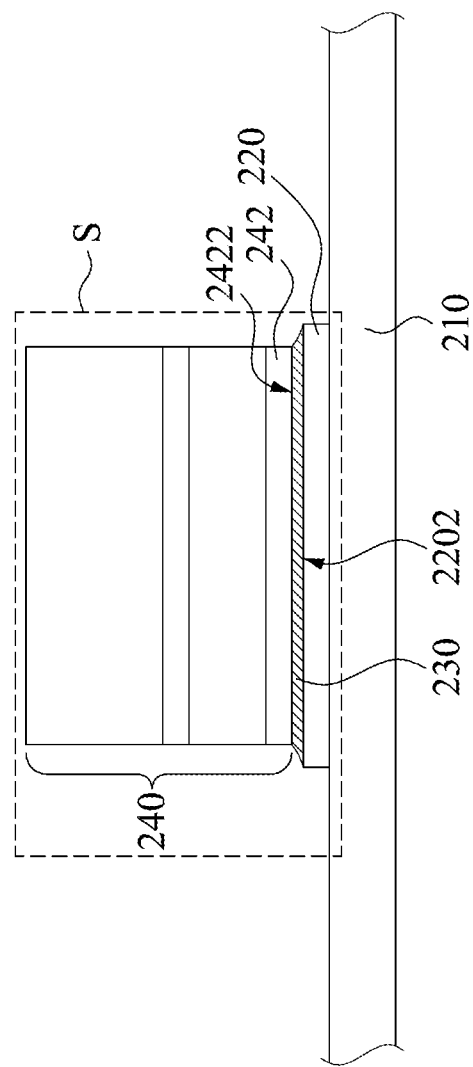
FIG. 3C is a schematic cross-sectional view of an intermediate stage of a method of liquid assisted bonding according to some embodiments of the present disclosure.
Figure 3C:
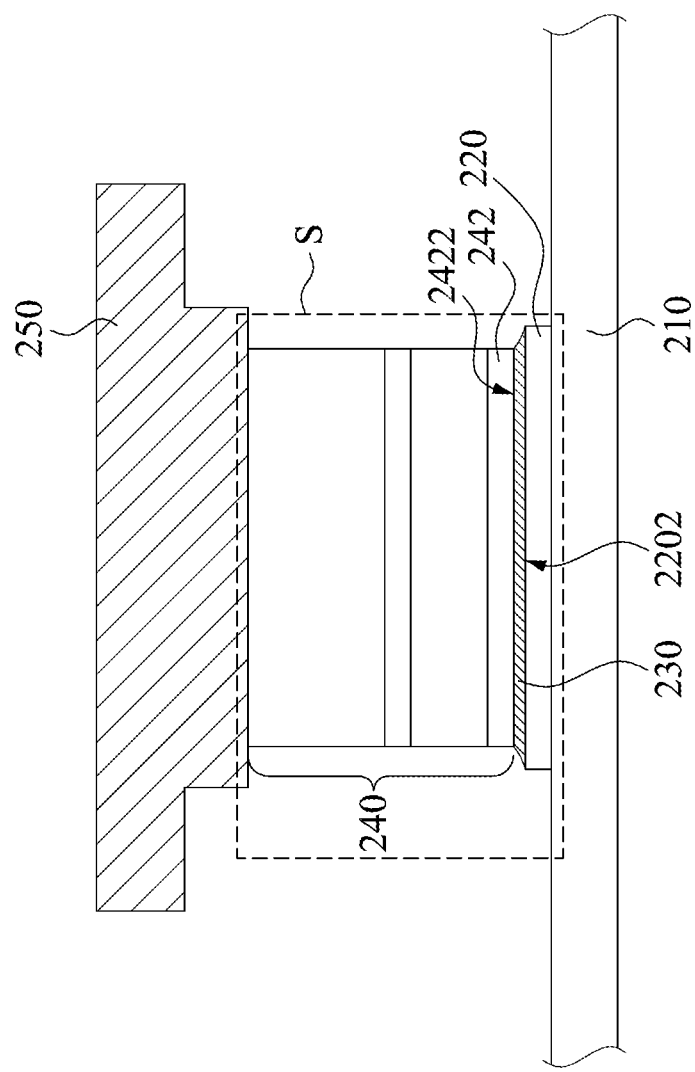

Reference is made to FIGS. 3C and 3C' in which the structure S is formed. In some embodiments, when the device 240 is in contact with the liquid layer 230, the device 240 is gripped by a capillary force produced by at least some portions of the liquid layer 230 which are between the device 240 and the contact pad 220. Hydrogen bonds (which will be depicted in FIG. 4A later) are formed between the liquid layer 230 and the electrode 242 and/or between the liquid layer 230 and the contact pad 220. In some embodiments, oxide-ionic bonds (which will be labeled in FIG. 4A later) are also formed between the liquid layer 230 and the electrode 242 and/or between the liquid layer 230 and the contact pad 220. In some embodiments, the device 240 is placed by a transfer head 250 (as referred to FIG. 3C') via a mechanical force (e.g., an adhesive force) or an electromagnetic force (e.g., an electrostatic force or an enhanced electrostatic force generated by an alternating voltage through bipolar electrodes), and should not be limited thereto. In some embodiments, a thickness of a portion of the liquid layer 230 between the electrode 242 and the contact pad 220 is smaller than a thickness of the device 240 when the device 240 is gripped by the capillary force produced by the liquid layer 230. In some alternative embodiments, an order between operation 110-2 and operation 110-3 can be exchanged. That is, the device 240 is placed onto the contact pad 220 first, and then the liquid layer 230 is formed on the substrate 210 and a portion of the liquid layer 230 is penetrated into a space between the electrode 242 and the contact pad 220 to grip the electrode 242 and the contact pad 220 by the capillary force. In some other alternative embodiments, forming the liquid layer 230 can be performed both before and after the device 240 is placed onto the contact pad 220. In still some other embodiments, the liquid layer 230 is formed on a side of the device 240 opposite to the transfer head 250 when the device 240 is picked up by the transfer head 250 and ready for (i.e., before) contacting the device 240 to the contact pad 220 by the transfer head 250. In some embodiments, the electrode 242 includes a bonding material. The bonding material includes one of tin, indium, titanium, and a combination thereof. One of tin, indium, and titanium accounts for more than half of a number of atoms of the bonding material. In some embodiments, the electrode 242 includes one of copper and copper-rich material. The copper-rich material is a material with copper accounts for more than half of a number of atoms therein.

Figure 3D:
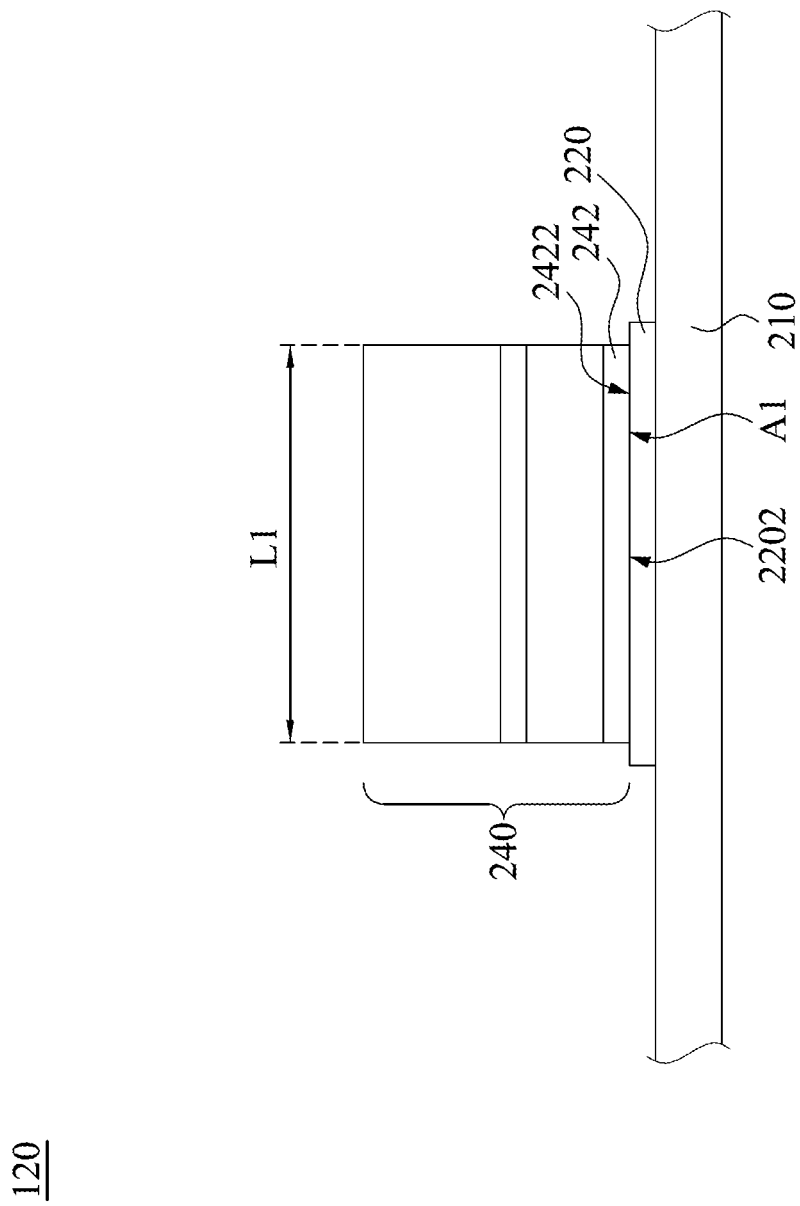
FIG. 3D is a schematic cross-sectional view of an intermediate stage of a method of liquid assisted bonding according to some embodiments of the present disclosure.

Reference is made to FIG. 3D. The liquid layer 230 is evaporated to break the hydrogen bonds and/or the oxide-ionic bonds as mentioned such that at least one of a surface 2422 of the electrode 242 facing the contact pad 220 and a surface 2202 of the contact pad 220 facing the electrode 242 is activated so as to assist a formation of a diffusion bonding between the electrode 242 of the device 240 and the contact pad 220. A contact area A1 between the electrode and the contact pad is smaller than or equal to about 1 square millimeter. Specifically, the contact area A1 is formed by the contact between the surface 2422 of the electrode 242 and the surface 2202 of the contact pad 220. The limitation of a size of the contact area A1 as mentioned is to ensure the domination of the capillary force and thus there is enough trend to activate the surface 2422 and the surface 2202 so as to assist the formation of the diffusion bonding. In some embodiments, the liquid layer 230 is evaporated by increasing a temperature of the contact pad 220 such that the electrode 242 is stuck to the contact pad 220 after the liquid layer 230 is evaporated. In some embodiments, the liquid layer 230 is evaporated with a temperature about a boiling point of the liquid layer 230.

Figure 4A:
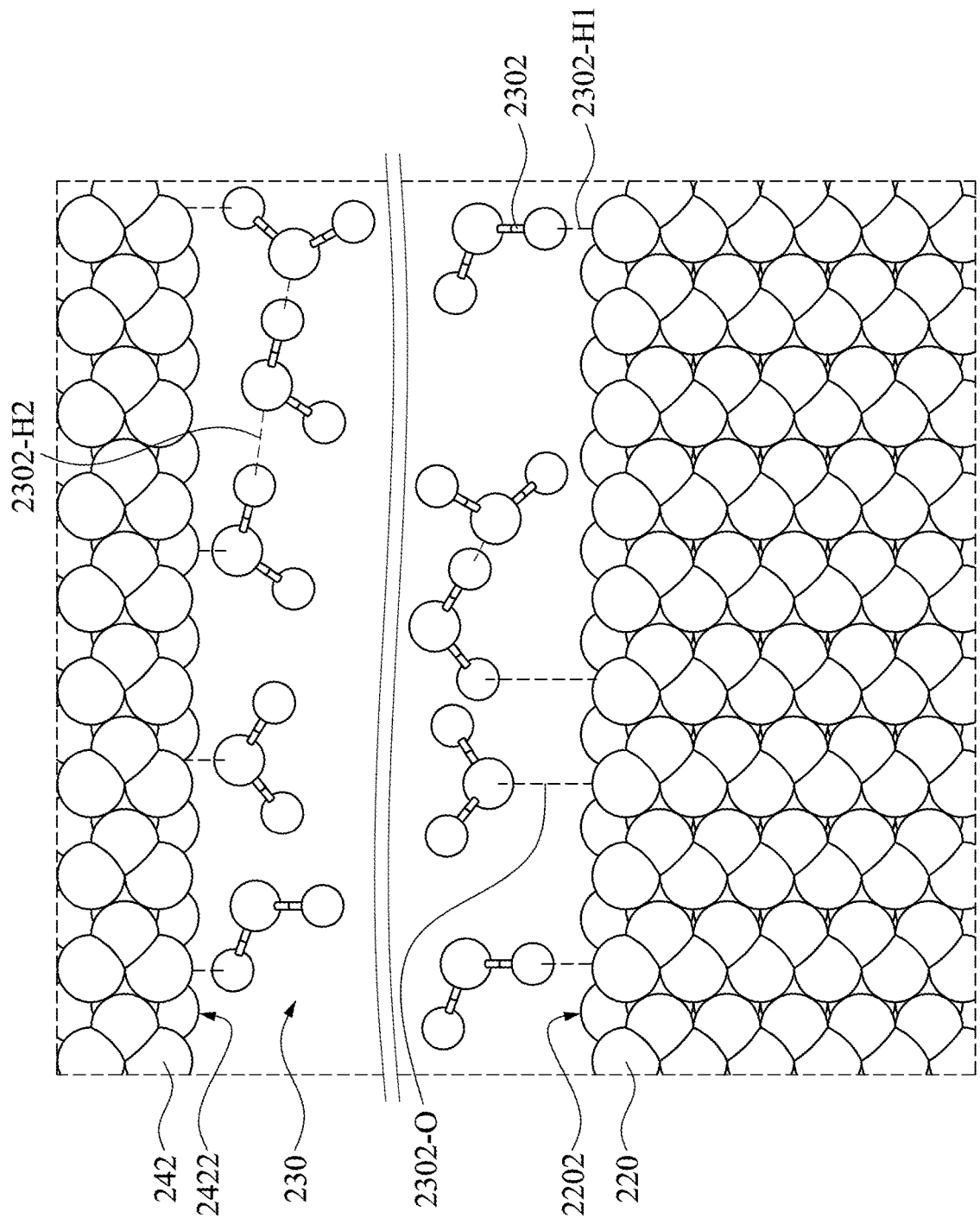
FIG. 4A is a schematic enlarged cross-sectional view of interfaces between a liquid layer and an electrode and between the liquid layer and a contact pad according to some embodiments of the present disclosure.
Figure 4B:
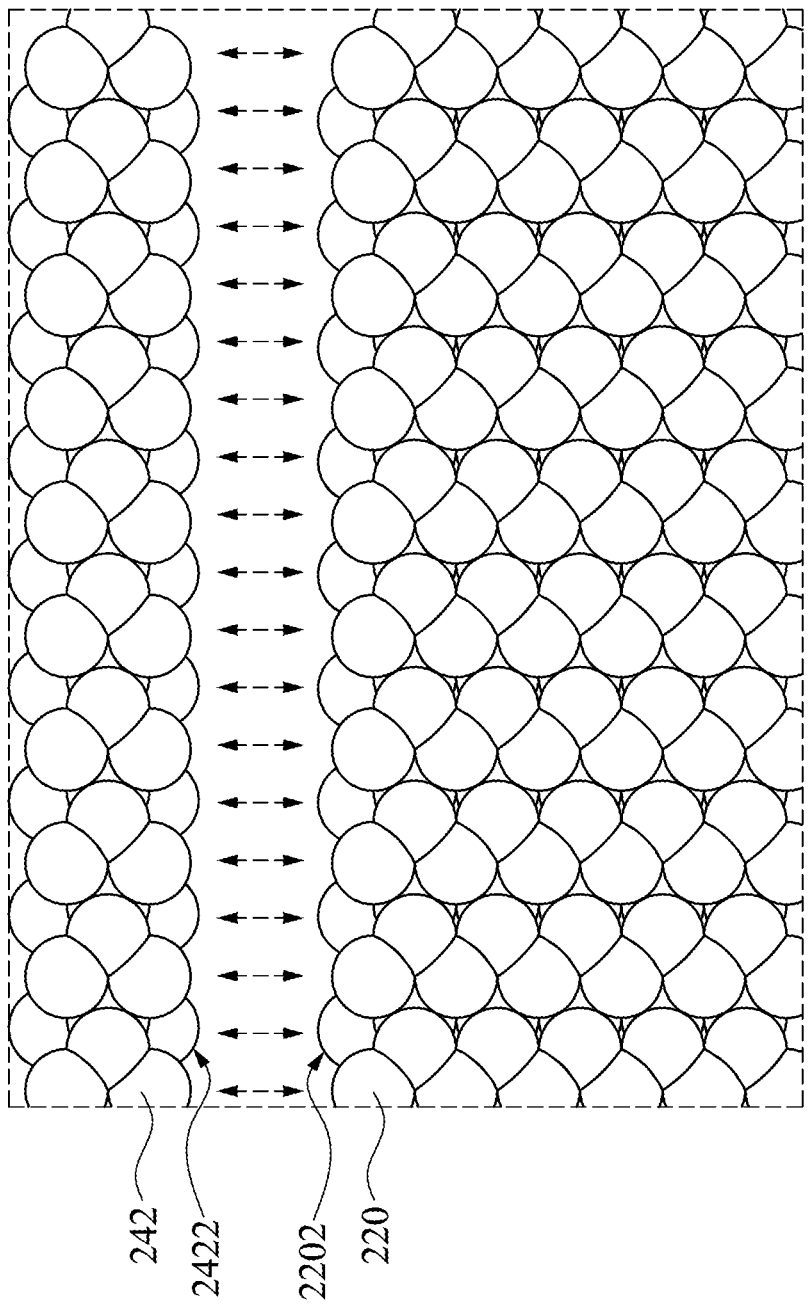
FIG. 4B is a schematic enlarged cross-sectional view of a electrode facing a contact pad and a contact pad facing the electrode after a liquid layer between the electrode and the contact pad is evaporated according to some embodiments of the present disclosure.

Reference is made to FIGS. 4A and 4B. FIG. 4A is a schematic enlarged cross-sectional view of interfaces between the liquid layer 230 and the electrode 242 and between the liquid layer 230 and the contact pad 220 according to some embodiments of the present disclosure. FIG. 4B is a schematic enlarged cross-sectional view of a surface 2422 of the electrode 242 facing the contact pad 220 and a surface 2202 of the contact pad 220 facing the electrode 242 after the liquid layer 230 is evaporated according to some embodiments of the present disclosure. When the liquid layer 230 is between the electrode 242 and the contact pad 220, the capillary force produced by the liquid layer 230 holds the electrode 242 and the contact pad 220 together, and some hydrogen bonds 2302-H1 and/or ionic bonds 2302-O may be formed on an interface between the liquid layer 230 and the contact pad 220 and on an interface between the liquid layer 230 and the electrode 242.

Embodiments illustrated by FIG. 4A shows the cross-sectional view in a molecular scale in which the liquid layer 230 has water molecules 2302. Some hydrogen bonds 2302-H1 are formed between the liquid layer 230 and atoms (molecules) of the surface 2202 of the contact pad 220 in contact with the liquid layer 230. Some hydrogen bonds 2302-H1 are formed between the liquid layer 230 and atoms (molecules) of the surface 2422 of the electrode 242 in contact with the liquid layer 230. Some hydrogen bonds 2302-H2 are between two different water molecules. Some oxide-ionic bonds 2302-O are formed between the liquid layer 230 and atoms (molecules) of the surface 2202 of the contact pad 220 in contact with the liquid layer 230. Some oxide-ionic bonds 2302-O are formed between the liquid layer 230 and atoms (molecules) of the surface 2422 of the electrode 242 in contact with the liquid layer 230. Therefore, the total energy of a system consisted of the electrode 242, the liquid layer 230, and the contact pad 220 is lowered down (more stable). When the liquid layer 230 is evaporated (as shown in FIG. 4B), the lower energy as mentioned tends to activate formations of electron clouds overlapping (i.e., an orbital overlap) between atoms of the electrode 242 and atoms of the contact pad 220, and then the binding is formed between the electrode 242 and the contact pad 220 to assist the formation of the diffusion bonding later.

The structural integrity between the electrode 242 and the contact pad 220 after the binding is strong enough to hold the device 240 on position and form the electrical contact between the electrode 242 and the contact pad 220. It is also noted that the "liquid assisted bonding" is preferably effective when a lateral length L1 of the device 240 is smaller than or equal to about 100 μm (i.e., a "micro" device 240) since a smaller lateral length of the device 240 results in a higher ratio between a length of a periphery of a contact region and an area of the contact region (i.e., the contact area A1), which facilitates the influence of the capillary force and thus the formation of binding. Also, it is preferable for the contact area A1 as mentioned for one device 240 to be smaller than or equal to about 1 mm$^2$. If the contact area A1 is too large, the capillary force will be too small to help the electron clouds overlapping between the atoms on the surface 2422 of the electrode 242 and the atoms on the surface 2202 of the contact pad 220. Given the foregoing explanation, in some auxiliary embodiments, the electrode 242 is a patterned electrode including at least two isolated portions, and the isolated portions are electrically isolated from one another, so as to increase the ratio between the length of a periphery of a contact region and an area of the contact region.

In some embodiments, one of the surface 2422 of the electrode 242 facing the contact pad 220 and the surface 2202 of the contact pad 220 facing the electrode 242 is hydrophilic. The "hydrophilic" herein means a surface having a contact angle smaller than 90 degrees. Hydrophilic surfaces 2422, 2202 can be formed by treating the surfaces 2422, 2202 with ozone ($O_3$) or hydrogen peroxide solution ($H_2O_2$), but should not be limited thereto. Sine the hydrogen bonds 2302-H1 and the oxide-ionic bonds 2302-O are more like to form on a hydrophilic surface, the potential energy becomes lower (i.e., more stable, or higher surface energy) after the hydrogen bonds 2302-H1 and the oxide-ionic bonds 2302-O are formed between the liquid layer 230 and the electrode 242 and/or between the liquid layer 230 and the contact pad 220. As a result, when the liquid layer 230 is evaporated (or generally, removed) later, there is a stronger tendency for electron clouds of the atoms on the surface 2422 of the electrode 242 and electron clouds of the atoms on the surface 2202 of the contact pad 220 to be overlapped and thus surfaces created by said evaporation is eliminated.

Figure 5:
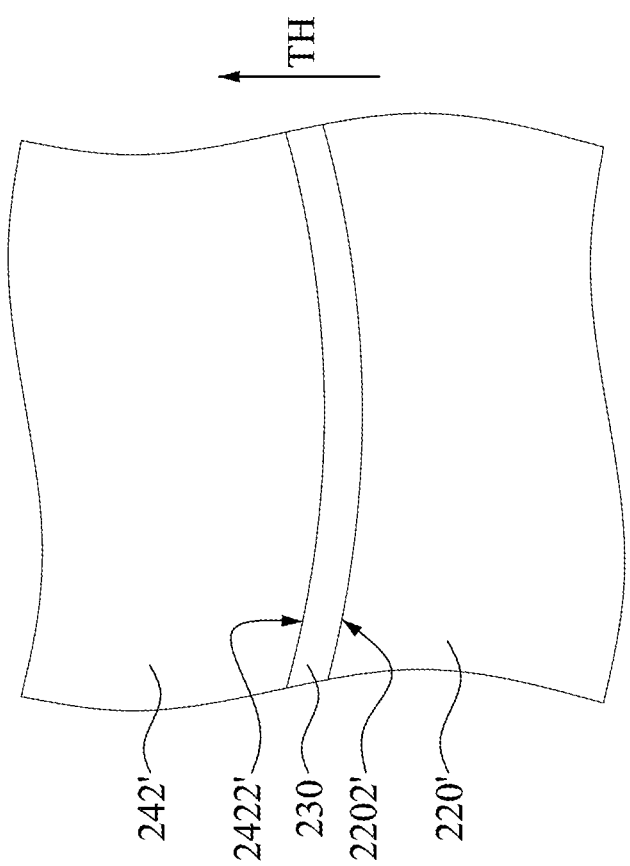
FIG. 5 is a schematic cross-sectional view of an interface between the liquid layer and the electrode and an interface between the liquid layer and the contact pad according to some embodiments of the present disclosure.

Reference is made to FIG. 5. FIG. 5 is a schematic cross-sectional view on the interface between the liquid layer 230 and the electrode 242' and the interface between the liquid layer 230 and the contact pad 220' according to some embodiments of the present disclosure. In some embodiments, the surface 2422' of the electrode 242' facing the contact pad 220' and the surface 2202' of the contact pad 220' facing the electrode 242' are curved surfaces which are curved up or down in a thickness direction TH so as to increase the length of a periphery of the contact region. The thickness direction TH is perpendicular to a direction of measuring the lateral length L1 of the device 240.

In some embodiments, a temperature of the contact pad 220 is further increased to be below a eutectic point between the contact pad 220 and the electrode 242 and above a boiling point of the liquid layer 230 after evaporating the liquid layer 230. Said "below" means a temperature point below the eutectic point (and also, a melting point of one of the contact pad 220 and the electrode 242) but enough to induce an interstitial diffusion between the contact pad 220 and the electrode 242 such that the device 240 is "bonded" to the contact pad 220 to strengthen the solidity between the electrode 242 and the contact pad 220. In such embodiments, the device 240 can be better protected (i.e., free from damage during the bonding process) due to a lower temperature bonding process. Besides, since there is no "melting", a position precision of the device 240 on the contact pad 220 is further enhanced.

In some other embodiments, the substrate 210 is heated to a temperature point below a melting point of one of the electrode 242 and the contact pad 220 to form the diffusion bonding. One of the electrode 242 and the contact pad 220 includes at least one of copper, titanium, tin, and indium, and the other of the electrode and the contact pad includes conductive oxide. In some embodiments, the conductive oxide is an indium tin oxide (ITO). It is noted that in a conventional bonding process, there is no such a way to bond a metal to a conductive oxide in the temperature point below said melting point (e.g., one of the electrode 242 and the contact pad 220 having a lower melting point).

In some embodiments, the temperature of the contact pad 220 is increased to be a temperature point such that an interstitial diffusion occurs to bond the electrode 242 to the contact pad 220. In still some other embodiments, the temperature of the contact pad 220 is increased to be above the eutectic point of the contact pad 220 and the electrode 242 after evaporating the liquid layer 230. To satisfy a balance between the criterion for the interstitial diffusion to occur and a trend to decrease a size of a device, a thickness of the electrode 242 can be set in a range from about 0.2 µm to about 2 µm.

Figure 6:
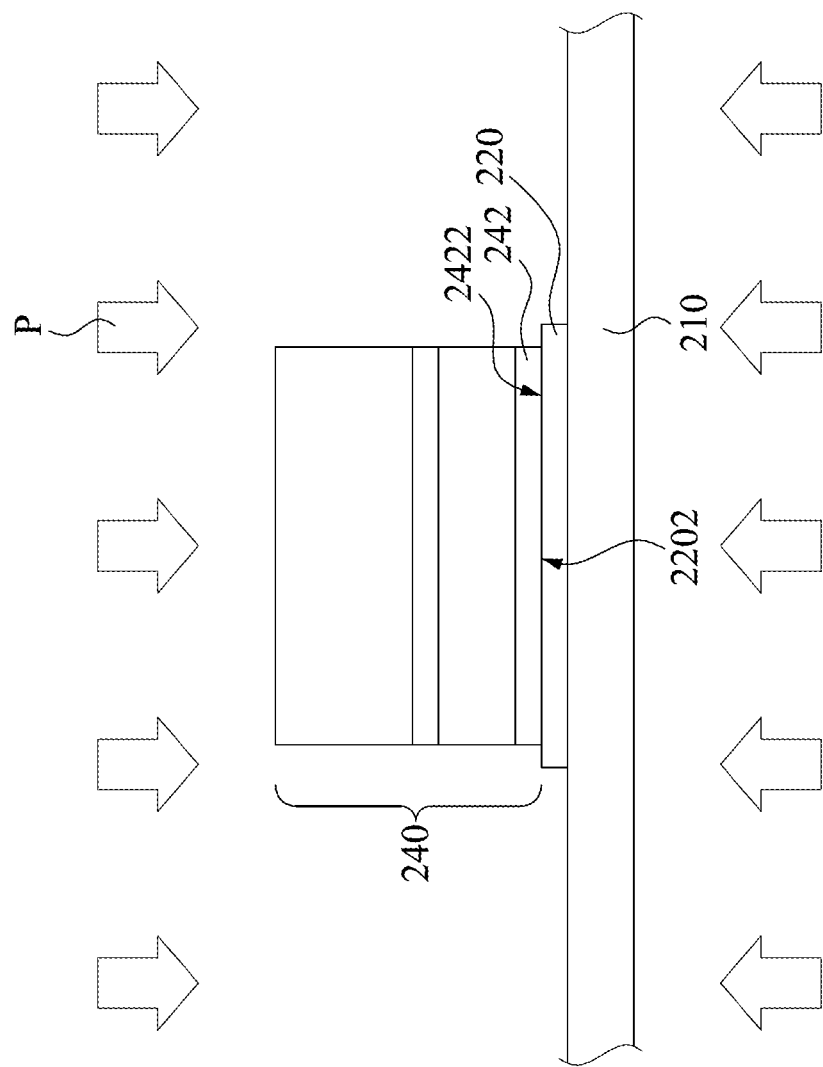
FIG. 6 is a schematic cross-sectional view of an optional intermediate stage of a method of liquid assisted bonding according to some embodiments of the present disclosure.

Reference is made to FIG. 6. FIG. 6 is a schematic cross-sectional view of an optional intermediate stage of the method 100 of liquid assisted bonding according to some embodiments of the present disclosure. In some embodiments, an external pressure P is applied to compress the electrode 242 and the contact pad 220 during evaporating the liquid layer 230 to further assist contacting the electrode 242 to the contact pad 220 for a deeper diffusion bonding therebetween to occur. The external pressure P can be applied by an additional plate (e.g., a flat plate) placed on the device 240 or changing the environmental pressure to press the device 240 and the contact pad 220, but should not be limited thereto. In some embodiments, the external pressure P with a value less than or equal to about 1 atmospheric pressure (atm) can be applied to the device 240 within a space (e.g., a chamber) having the environmental pressure with a value about 0.1 torr (about $10^{-4}$ atm), but should not be limited thereto.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of liquid assisted bonding, comprising:
    forming a structure with a liquid layer between an electrode of a device and a contact pad of a substrate and two opposite surfaces of the liquid layer being respectively in contact with the electrode and the contact pad, wherein hydrogen bonds are formed between the liquid layer and at least one of the electrode and the contact pad; and
    evaporating the liquid layer to break said hydrogen bonds such that at least one of a surface of the electrode facing the contact pad and a surface of the contact pad facing the electrode is activated so as to assist a formation of a diffusion bonding between the electrode of the device and the contact pad, wherein a contact area between the electrode and the contact pad is smaller than or equal to about 1 square millimeter.

2. The method of claim 1, wherein the surface of the electrode facing the contact pad and the surface of the contact pad facing the electrode are curved surfaces which are curved up or down in a thickness direction.

3. The method of claim 1, further comprising:
    applying an external pressure to compress the electrode and the contact pad during evaporating the liquid layer.

4. The method of claim 1, further comprising:
    heating the substrate to a temperature point below an eutectic point of the electrode and the contact pad and above a boiling point of the liquid layer to form the diffusion bonding, wherein the electrode and the contact pad comprise metals, and at least one of the electrode and the contact pad comprises at least one of copper, titanium, tin, and indium.

5. The method of claim 1, further comprising:
    heating the substrate to a temperature point below a melting point of one of the electrode and the contact pad to form the diffusion bonding, wherein said one of the electrode and the contact pad comprises at least one of copper, titanium, tin, and indium, and the other of the electrode and the contact pad comprises conductive oxide.

6. The method of claim 1, wherein a lateral length of the device is less than or equal to about 100 µm.

7. The method of claim 1, wherein oxide-ionic bonds are formed between the electrode and the liquid layer, or between the contact pad and the liquid layer after the formation of the structure.

8. The method of claim 7, wherein the oxide-ionic bonds are broken when the liquid layer is evaporated.

9. The method of claim 1, wherein one of the surface of the electrode facing the contact pad and the surface of the contact pad facing the electrode is hydrophilic.

10. A method of liquid assisted bonding, comprising:
    forming a structure with a liquid layer between an electrode of a device and a contact pad of a substrate and two opposite surfaces of the liquid layer being respectively in contact with the electrode and the contact pad, wherein hydrogen bonds are formed between the liquid layer and at least one of the electrode and the contact pad;
    evaporating the liquid layer to break said hydrogen bonds such that at least one of a surface of the electrode facing the contact pad and a surface of the contact pad facing the electrode is activated so as to assist a formation of a diffusion bonding between the electrode of the device and the contact pad; and
    heating the substrate to a temperature point below a melting point of one of the electrode and the contact pad to form the diffusion bonding, wherein said one of the electrode and the contact pad comprises at least one of copper, titanium, tin, and indium, and the other of the electrode and the contact pad comprises conductive oxide.

11. The method of claim 10, wherein a contact area between the electrode and the contact pad is smaller than or equal to about 1 square millimeter.

12. The method of claim 10, wherein the surface of the electrode facing the contact pad and the surface of the contact pad facing the electrode are curved surfaces which are curved up or down in a thickness direction.

13. The method of claim 10, further comprising:
applying an external pressure to compress the electrode and the contact pad during evaporating the liquid layer.

14. The method of claim 10, wherein one of copper, titanium, tin, and indium is consisted of more than half number of atoms of the at least one of the electrode and the contact pad.

15. The method of claim 10, wherein a lateral length of the device is less than or equal to about 100 μm.

16. The method of claim 10, wherein oxide-ionic bonds are formed between the electrode and the liquid layer, or between the contact pad and the liquid layer after the formation of the structure.

17. The method of claim 16, wherein the oxide-ionic bonds are broken when the liquid layer is evaporated.

18. The method of claim 10, wherein one of the surface of the electrode facing the contact pad and the surface of the contact pad facing the electrode is hydrophilic.

19. The method of claim 10, wherein evaporating the liquid layer is performed with a temperature about a boiling point of the liquid layer.

20. The method of claim 10, wherein an orbital overlap is formed between the electrode and the contact pad so as to assist a formation of a diffusion bonding between the electrode of the device and the contact pad.

* * * * *